(12) United States Patent
Wu et al.

(10) Patent No.: US 11,664,429 B2
(45) Date of Patent: May 30, 2023

(54) WIDE BANDGAP FIELD EFFECT TRANSISTORS WITH SOURCE CONNECTED FIELD PLATES

(71) Applicant: CREE, INC., Goleta, CA (US)

(72) Inventors: Yifeng Wu, Goleta, CA (US); Primit Parikh, Goleta, CA (US); Umesh Mishra, Montecito, CA (US); Marcia Moore, Santa Barbara, CA (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 15/696,050

(22) Filed: Sep. 5, 2017

(65) Prior Publication Data

US 2017/0365670 A1    Dec. 21, 2017

Related U.S. Application Data

(63) Continuation of application No. 10/958,945, filed on Oct. 4, 2004, now Pat. No. 9,773,877.

(60) Provisional application No. 60/571,342, filed on May 13, 2004.

(51) Int. Cl.
| | |
|---|---|
| *H01L 29/812* | (2006.01) |
| *H01L 29/40* | (2006.01) |
| *H01L 29/417* | (2006.01) |
| *H01L 29/423* | (2006.01) |
| *H01L 29/20* | (2006.01) |

(52) U.S. Cl.
CPC ...... *H01L 29/402* (2013.01); *H01L 29/41725* (2013.01); *H01L 29/42316* (2013.01); *H01L 29/812* (2013.01); *H01L 29/2003* (2013.01)

(58) Field of Classification Search
CPC ............. H01L 29/402; H01L 29/41725; H01L 29/42316; H01L 29/812; H01L 29/2003
USPC ........................................................ 257/192
See application file for complete search history.

(56) References Cited

U.S. PATENT DOCUMENTS

| | | | |
|---|---|---|---|
| 6,586,781 B2 | 7/2003 | Wu | |
| 6,933,544 B2* | 8/2005 | Saito | ..................... H01L 29/402 |
| | | | 257/192 |
| 7,075,125 B2* | 7/2006 | Saito | ..................... H01L 29/404 |
| | | | 257/194 |
| 2002/0145172 A1* | 10/2002 | Fujishima | ............. H01L 29/402 |
| | | | 257/487 |

(Continued)

OTHER PUBLICATIONS

Chini, A., et al., "Power and Linearity Characteristics of Field-Plated Recessed-Gate AlGaN—GaN HEMTs", IEEE Electron Device Letters, vol. 25, No. 5, May 2004, pp. 229-231.

(Continued)

*Primary Examiner* — Ori Nadav
(74) *Attorney, Agent, or Firm* — Myers Bigel, P.A.

(57) ABSTRACT

A field effect transistor comprising a buffer and channel layer formed successively on a substrate. A source electrode, drain electrode, and gate are all formed in electrical contact with the channel layer, with the gate between the source and drain electrodes. A spacer layer is formed on at least a portion of a surface of the channel layer between the gate and drain electrode and a field plate is formed on the spacer layer isolated from the gate and channel layer. The spacer layer is electrically connected by at least one conductive path to the source electrode, wherein the field plate reduces the peak operating electric field in the device.

26 Claims, 2 Drawing Sheets

(56) References Cited

U.S. PATENT DOCUMENTS

2004/0021182 A1* 2/2004 Green ................ H01L 29/405
257/409

OTHER PUBLICATIONS

Xu, Hongtao, et al., "A New Field-Plated GaN HEMT Structure with Improved Power and Noise Performance", International Journal of High Speed Electronics and Systems, vol. 14, No. 3, (2004), pp. 186-191.
Communication Pursuant to Article 94(3) EPC, issued in corresponding European Application No. 11 183 404.0, dated Dec. 4, 2020.

* cited by examiner

WIDE BANDGAP FIELD EFFECT TRANSISTORS WITH SOURCE CONNECTED FIELD PLATES

This application is a Continuation application of U.S. patent application Ser. No. 10/958,945, filed Oct. 4, 2004, which claims the benefit of Provisional Application Ser. No. 60/571,342 to Wu et al., which was filed on May 13, 2004. All applications referenced in this paragraph are hereby incorporated by reference as if set forth fully herein.

BACKGROUND OF THE INVENTION

Field of the Invention

The present invention relates to transistors and particularly to field effect transistors utilizing field plates.

Description of the Related Art

Improvements in the manufacturing of AlGaN/GaN semiconductor materials have helped advance the development of AlGaN/GaN transistors, such as high electron mobility transistors (HEMTs) for high frequency, high temperature and high power applications. AlGaN/GaN has large bandgaps, high peak and saturation electron velocity values [B. Gelmont, K. Kim and M. Shur, *Monte Carlo Simulation of Electron Transport in Gallium Nitride*, J. Appl. Phys. 74, (1993), pp. 1818-1821].

Electron trapping and the resulting difference between DC and RF characteristics have been a limiting factor in the performance of these devices. Silicon nitride (SiN) passivation has been successfully employed to alleviate this trapping problem resulting in high performance devices with power densities over 10 W/mm at 10 Ghz. For example, U.S. Pat. No. 6,586,781 which is incorporated herein by reference in its entirety discloses methods and structures for reducing the trapping effect in GaN-based transistors. However, due to the high electric fields existing in these structures, charge trapping is still an issue.

Field plates (FP) have been used to enhance the performance of GaN-based HEMTs at microwave frequencies [See S Kamalkar and U. K. Mishra, *Very High Voltage AlGaN/GaN High Electron Mobility Transistors Using a Field Plate Deposited on a Stepped Insulator*, Solid State Electronics 45, (2001), pp. 1645-1662]. These approaches, however, have involved a field plate connected to the gate of the transistor with the field plate on top of the drain side of the channel. This can result in a significant field plate to drain capacitance and the field plate connected to the gate adds additional gate-to-drain capacitance ($C_{gd}$) to the device. This can not only reduce gain, but can also cause instability due to poorer input-output isolation.

SUMMARY OF THE INVENTION

The present invention provides improved field effect transistors having a field plate connected to the source electrode. One embodiment of a field effect transistor according to the present invention comprises a field effect transistor having a buffer layer on a substrate and a channel layer on the buffer layer with the buffer layer sandwiched between the channel layer and substrate. A source electrode is included in electrical contact with said plurality of the channel layer, along with a drain electrode in electrical contact with said channel layer. A gate is included in electrical contact with the channel layer and between the source and drain electrodes. A spacer layer is over at least a portion of the channel layer between the gate and the drain electrode. A field plate is formed on the spacer layer and electrically isolated from the channel layer and gate, with the field plate electrically connected to the source electrode by at least one conductive path.

Another embodiment of a field effect transistor according to the present invention comprises a buffer layer and channel layer formed successively on a substrate. A source electrode, drain electrode, and gate are all formed in electrical contact with the channel layer, with the gate between the source and drain electrodes. A spacer layer is formed on at least a portion of a surface of the channel layer between the gate and drain electrode and a field plate is separately formed on the spacer layer isolated from the gate and channel layer. The spacer layer is electrically connected by at least one conductive path to the source electrode, wherein the field plate reduces the peak operating electric field in the transistor.

Still another embodiment of a transistor according to the present invention comprises a field effect transistor having a buffer layer and channel layer formed successively on a substrate. Source electrode, drain electrode, and gate are all formed in electrical contact with the channel layer with the gate between the source and drain electrodes. A field plate extends a distance $L_f$ from the edge of the gate to the drain electrode with the field plate isolated from the gate and active layers. At least one conductive path electrically connects the field plate to the source electrode, with the at least one conductive path covering less than all of the topmost surface between the gate and source electrode.

Still another embodiment of a transistor according to the present invention comprises an active region having a channel, source electrode, drain electrode, and gate all in electrical contact with the channel layer, with the gate between the source and drain electrodes on the active region. A spacer layer over at least a portion of the active region between the gate and the drain electrode. A field plate on the spacer layer and isolated from the active region and gate, the field plate electrically connected to the source electrode by at least one conductive path. The field plate extending a distance $L_f$ as measured from the edge of the gate to the drain electrode.

These and other further features and advantages of the invention would be apparent to those skilled in the art from the following detailed description, taking together with the accompanying drawings, in which:

DETAILED DESCRIPTION OF THE INVENTION

Figure 1:
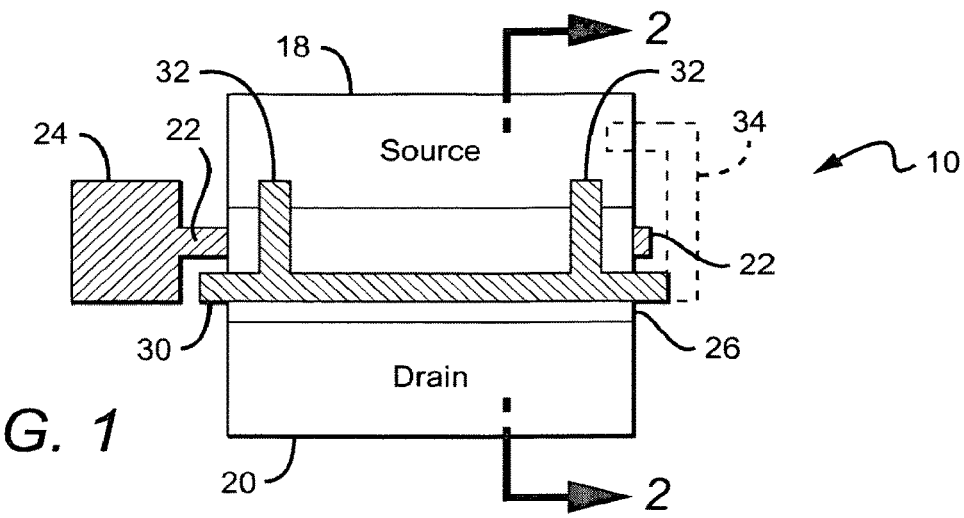
FIG. 1 is a plan view of one embodiment of a MESFET according to the present invention.

The field plate arrangements according to the present invention can be used with many different transistor structures. Wide bandgap transistor structures generally include an active region, with metal source and drain electrodes formed in electrical contact with the active region, and a gate electrode formed between the source and drain electrodes for modulating electric fields within the active region. A spacer layer is formed above the active region. The spacer layer can comprise a dielectric layer, or a combination of multiple dielectric layers. A conductive field plate is formed on the spacer layer and extends a distance $L_f$ from the edge of the gate electrode toward the drain electrode.

The field plate can be electrically connected to the source electrode. This field plate arrangement can reduce the peak electric field in the device, resulting in increased breakdown voltage and reduced trapping. The reduction of the electric field can also yield other benefits such as reduced leakage currents and enhanced reliability. By having the field plate electrically connected to the source electrode, the reduced gain and instability resulting from gate connected field plates is reduced. When arranged according to the present invention, the shielding effect of a source-connected field plate can reduce $C_{gd}$, which enhances input-output isolation.

One type of transistor that can utilize the field plate arrangement according to the present invention is a field effect transistor and particularly a metal semiconductor field effect transistor (MESFET), which typically includes a buffer layer and a channel layer on the buffer layer. A gate electrode is formed on the channel layer between source and drain electrodes.

According to the present invention, a spacer layer is formed on the channel layer covering at least a portion of the channel layer between the gate and drain electrode such that a field plate can be formed on the spacer layer in electric isolation from the channel layer. In other embodiments the spacer layer can also cover all or some of the gate such that the field plate can overlap the gate while remaining in electrical isolation from the gate and the channel layer. In a preferred embodiment the spacer layer covers the gate and the surface of the barrier layer between the gate and the source and drain electrodes. The spacer layer can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof, or epitaxial materials as further described below.

A conductive field plate is formed on the spacer layer and extends a distance $L_f$ as measured from the edge of the gate towards the drain electrode, with the field plate and gate electrode typically being formed during separate deposition steps. The field plate is electrically connected to the source electrode typically by conductive paths arranged in different ways.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

Figure 2:
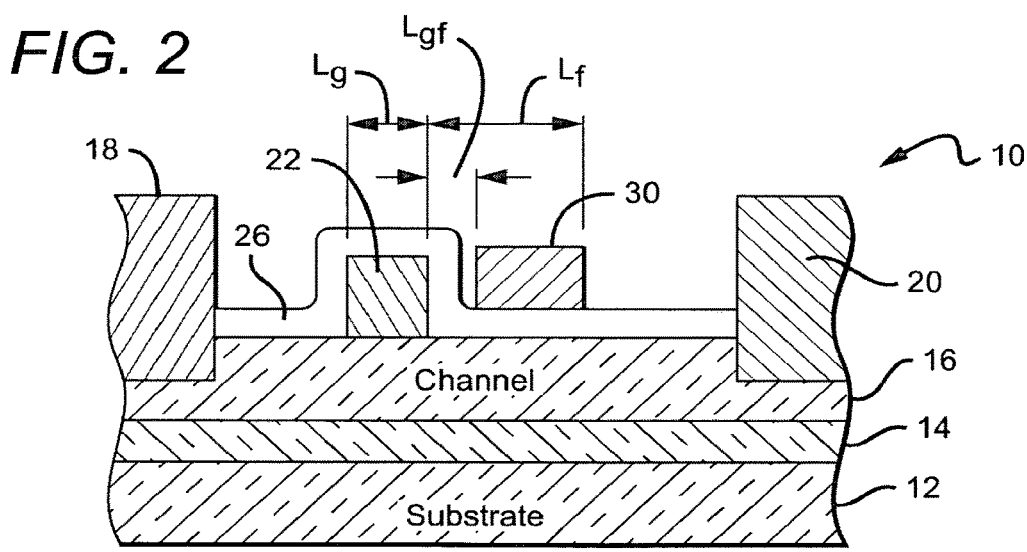
FIG. 2 is a sectional view of the MESFET in FIG. 1.

FIGS. 1 and 2 show one embodiment of a MESFET 10 according to the present invention that can be made from many different semiconductor material systems, with a preferred MESFET 10 being silicon carbide based. MESFET comprises a substrate 12 that can be made of many different materials capable of supporting growth of a silicon carbide. The preferred substrate material is silicon carbide and in some embodiments, the substrate 12 can comprise semi-insulating 4H—SiC commercially available from Cree, Inc. of Durham, N.C.

The MESFET 10 further comprises a silicon carbide buffer layer 14 formed on the substrate 12 with a silicon carbide channel layer 16 formed on the buffer, with the buffer layer 14 sandwiched between the channel layer 16 and substrate 12. The buffer and channel layers 14, 16 can be formed on the substrate 12 using known semiconductor growth techniques such as Metal Oxide Chemical Vapor Deposition (MOCVD), Hydride Vapor Phase Epitaxy (HVPE) or Molecular Beam Epitaxy (MBE).

A nucleation layer (not shown) can be included between the substrate 12 and the buffer 14 to reduce any lattice mismatch between the two. The nucleation layer can comprise many different materials, can also be formed on the substrate 12 using MOCVD, HVPE or MBE. The formation of the nucleation layer can depend on the material used for the substrate 12. For example, methods of forming a nucleation layer on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

Metal source and drain electrodes 18, 20 are formed in contact with the channel layer 16 and a gate 22 is formed on the channel layer 16 between the source and drain electrodes 18, 20. Electric current can flow between the source and drain electrodes 18, 20 through the channel layer 16 when the gate 22 is biased at the appropriate level. The source and drain contacts 18, 20 can be made of different materials including but not limited to alloys of titanium, aluminum, gold or nickel. nickel, gold, platinum, titanium, chromium, alloys of titanium and tungsten, or platinum silicide. The gate 24 can have many different lengths, with a preferred gate length ($L_g$) being approximately 0.5 microns. As best shown in FIG. 1, the gate 22 is connected to and contacted at a gate contact 24.

As best shown in FIG. 2, a first spacer layer 26 is formed over the gate 22 and the surface of the channel layer 16 between the gate 22 and the source and drain electrodes 18, 20. As mentioned above, however, the spacer layer 26 can cover less of the channel layer and the gate as long as enough of a spacer layer is provided to isolate the field plate from the gate and channel layer. The spacer layer 26 can comprise many of the different materials above, alone or in combination, but preferably comprises a layer of one of the dielectric materials listed above, or a number of different layers of dielectric materials. The spacer layer 26 can be many different thicknesses, with a suitable range of thicknesses be approximately 0.05 to 2 microns. Electric isolation between the devices is done with mesa etch or ion implementation outside the active area of the MESFET.

When the spacer layer 26 is formed before device metallization the spacer layer 26 can comprise an epitaxial material such a Group III nitride material having different Group III elements such as alloys of Al, Ga, or In, with a suitable spacer layer material being $Al_xGa_{1-x}N$ ($0 \leq x \leq 1$).

After epitaxial growth of the channel layer 16, the spacer layer 26 can be grown using the same epitaxial growth method. The spacer layer 26 is then etched such that the gate 22, source electrode 18 and drain electrode 20 can be properly formed in contact with the channel layer 16 and the spacer layer 26. A field plate 30 can then be deposited on the spacer layer 26 between the gate 22 and drain electrode 20. In those embodiments where the field plate 30 overlaps the gate 22, an additional spacer layer 26 of dielectric material should be included at least partially over the gate 22 to isolate the gate 22 from the field plate 30.

A field plate 30 is formed on the spacer layer 26 between the gate 22 and the drain electrode 20, with the field plate 30 being in close proximity to the gate 22 but not overlapping it. A space between the gate 22 and field plate ($L_{gf}$) remains and should be wide enough to isolate from the field plate 30, while being small enough to maximize the field effect provided by the field plate 30. If $L_{gf}$ is too wide the field effect can be reduced. In one embodiment according to the present invention $L_{gf}$ can be approximately 0.4 microns or less, although larger and smaller spaces can also be used.

The field plate 30 can extend different distances $L_f$ from the edge of the gate 24, with a suitable range of distances being approximately 0.1 to 2 microns. The field plate 30 can comprise many different conductive materials with a suitable material being a metal, or combinations of metals, deposited using standard metallization methods. In some embodiments according to the present invention the field plate 30 comprises titanium/gold or nickel/gold.

The field plate 30 is electrically connected to the source contact 18 and FIG. 1 shows two connection structures that can be used according to the present invention, although it is understood that other connection structures can also be used. In those embodiments where the spacer layer covers the gate and the surface of the channel layer between the gate 22 and source electrode 18, conductive buses 32 can be formed on the spacer layer 26 to extend between the field plate 30 and the source electrode 18. Different numbers of buses 32 can be used although the greater the number of buses the greater the unwanted capacitance that can be introduced by the buses. The buses should have a sufficient number so that current effectively spreads between the source contact 18 and the field plate 30 while not covering too much of the MESFET's active region, with a suitable number of buses 32 being two. In one embodiment, the conductive paths do not cover all of the topmost layers between the gate and source electrode, which will preferable be the spacer layer 26.

Alternatively, the spacer layer 26 can cover only the surface of the channel layer in strips (not shown) between the gate and source electrode, with the strips having a width sufficient to support the conductive buses 32. The buses 32 would then extend from the field plate 30 over those spacer layer areas that cover the channel layer.

The field plate 30 can also be electrically connected to the source contact 20 through a conductive path 34 that runs outside of the active regions and spacer layer 26 of the MESFET 10 and is coupled to the source contact 20. This arrangement can be used in other embodiments but it is particularly adapted for use in embodiments where the spacer layer 26 does not cover the channel layer 16 between the gate 22 and the source 18. As shown in FIG. 1, the path 34 runs outside the active area of the MESFET at the side opposite the gate 24. In alternative embodiments according to the present invention, the conductive path could run outside the active area of the MESFET 10 on the side of the gate 24, or the MESFET 10 could include two or more conductive paths running out the same or different sides of the MESFET 10.

After deposition of the field plate 30 and its connection to the source contact 20, the active structure can be covered by a dielectric passivation layer (not shown), such as silicon nitride. The passivation layer can be formed using known growth methods.

Figure 3:
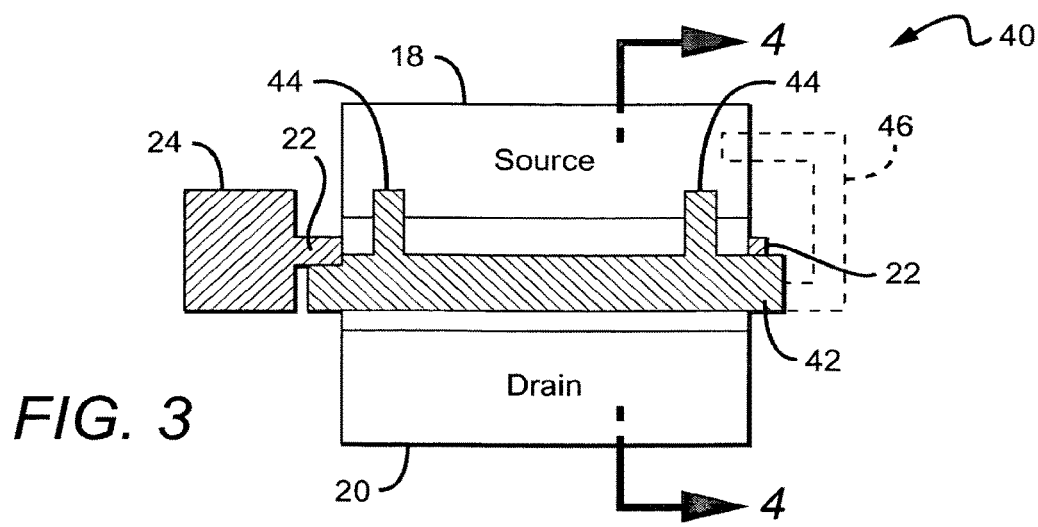
FIG. 3 is a plan view of another embodiment of a MESFET according to the present invention.
Figure 4:
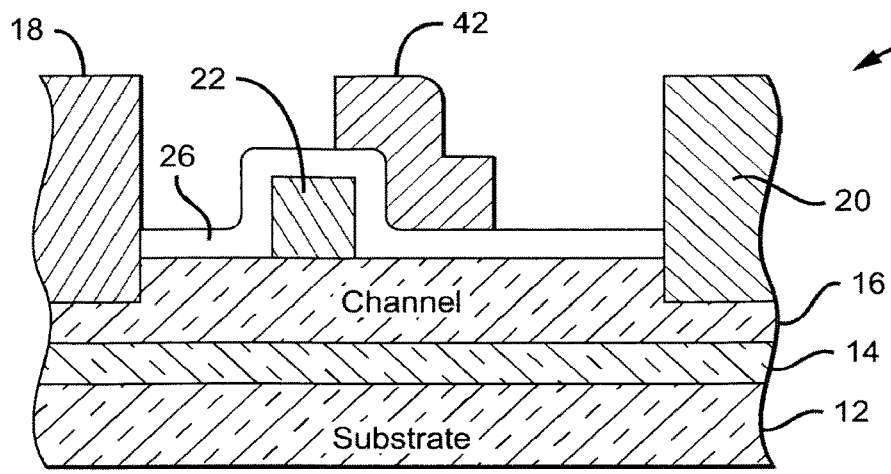
FIG. 4 is a sectional view of the MESFET in FIG. 3.

FIGS. 3 and 4 show another embodiment of a MESFET 40 according to the present invention having many features that are similar to those in MESFET 10. For the similar features the same reference numerals are used and the features are introduced without full description with the understanding that the description of the features above applies equally to the MESFET 40.

The MESFET 40 is preferably silicon carbide based and comprises a silicon carbide substrate 12, silicon carbide buffer layer 14, silicon carbide channel layer 16, source contact 18, drain contact 20, gate 22, gate contact 24 and spacer layer 26. The MESFET 40 also comprises a field plate 42 that is formed on the spacer layer 26 primarily between the gate 22 and the drain contact 20, but also overlapping a portion of the gate 22. For the MESFET 10 in FIGS. 1 and 2, $L_{gf}$ is small, which can present some difficulties during fabrication. By having the field plate 42 overlap the gate 22 the HEMT 40 can be fabricated without having to meet the tolerances of $L_{gf}$. The overlapping section of the field plate 42, however, can introduce additional unwanted capacitance. In determining whether to use a field plate 30 or 42 the ease of manufacturing using field plate 42 must be balanced with the reduced capacitance provided by field plate 30 in FIGS. 1 and 2. The MESFET 40 also comprises either buses 44 or a conductive path 34 to electrically connect the field plate 42 to the source contact 18.

Figure 5:
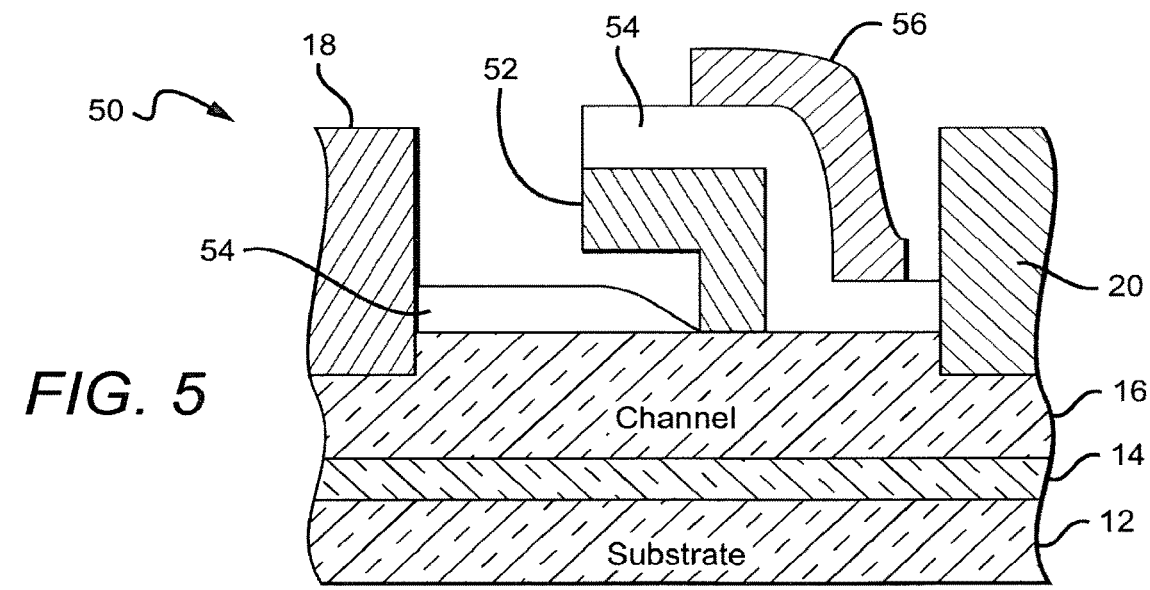
FIG. 5 is a sectional view of another embodiment of a MESFET according to the present invention having a gamma gate.

The source connected field plate arrangement according to the present invention can be used in many different MESFETs beyond those described above. For example, FIG. 5 shows another embodiment of a MESFET 50 according to the present invention that has many features similar to those in MESFETs 10 and 40, including a substrate 12, buffer layer 14, channel layer 16, source electrode 18, and drain electrode 20. MESFET 80, however, has a gamma (Γ) shaped gate 52 that is particularly adapted to high frequency operation. Gate length ($L_g$) is one of the important device dimensions in determining device speed, and with higher frequency devices the gate length is shorter. Shorter gate length can lead to high resistance that can negatively impact high frequency operation. T-gates are commonly used in high frequency operation, but it can be difficult to achieve a well-coupled placement of a field plate with a T-gate.

The gamma gate 52 provides for low gate resistance and allows for controlled definition of the gate footprint. A spacer layer 54 is included that covers the gamma gate 52 and the surface of barrier layer 16 between the gamma gate 52 and the source and drain electrodes 18, 20. A space can remain between the horizontal portion of the gamma gate 52 and the top of the spacer layer 54 between the gate 52 and the source electrode. The MESFET 50 also includes a field plate 56 on the spacer layer 54 that overlaps that gamma gate 52, with the field plate 56 preferably deposited on the side of the gamma gate 52 not having a horizontal overhanging section. This arrangement allows for tight placement and effective coupling between the field plate 56 and the active layers below it. In other gamma gate embodiments the field plate can be similarly arranged to field plate 56, but instead of overlapping the gate, there can be a space between the edge of the gate and the field plate similar to space $L_{gf}$ shown in FIG. 2.

The field plate 56 can be electrically connected to the source electrode 18 in many different ways. Because of the space between the lower surface of the horizontal section of the gate 52 and the spacer layer 54, it can be difficult to provide a conductive path directly between the field plate 56 and the source electrode 18. Instead, a conductive path can be included between the field plate 56 and the source electrode 18 that runs outside the active area of the MESFET 50. Alternatively, the gamma gate 52 can be completely covered by the spacer layer 54 with the space under the gate's horizontal section filled. Conductive paths can then run directly from the field plate 56 to the source electrode over the spacer layer 54. The active structure can then be covered by a dielectric passivation layer (not shown).

Figure 6:
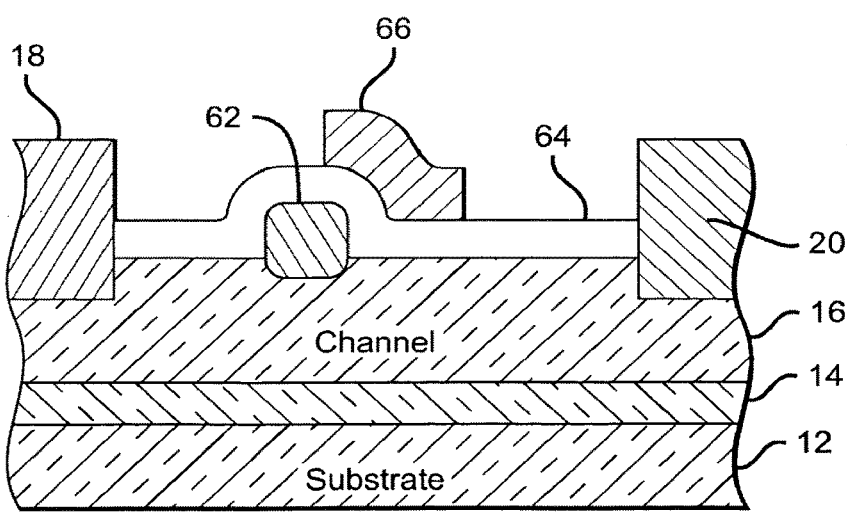
FIG. 6 is a sectional view of still another embodiment of a MESFET according to the present invention having a recessed gate.

FIG. 6 shows still another MESFET 60 according to the present invention that can also be arranged with a source connected field plate. MESFET 60 also has many features similar to those in MESFETs 10 and 40 in FIGS. 1-4, including a substrate 12, buffer layer 14, channel layer 16, source electrode 18, and drain electrode 20. The gate 62, however, is recessed in the channel layer 16, and is covered by a spacer layer 64. In other embodiments the bottom surface of the gate can be only partially recessed or different portions of the gate can be recessed to different depths in the channel layer 16. A field plate 66 is arranged on the spacer layer 64 and is electrically connected to the source electrode 18 and the active structure can be covered by a dielectric passivation layer (not shown). Like above of the MESFET 60, the field plate 66 can be arranged so that there is a space Lgf between the edge of the gate and the field plate.

The embodiments above provide wide bandgap transistors, particularly MESFETs, with improved power at microwave and millimeter wave frequencies. The MESFETs exhibit simultaneously high gain, high power, and more stable operation due to higher input-output isolation. The structure could be extended to larger dimensions for high voltage applications at lower frequencies.

Although the present invention has been described in considerable detail with reference to certain preferred configurations thereof, other versions are possible. The field plate arrangement can be used in many different devices. The field plates can also have many different shapes and can be connected to the source contact in many different ways. The spirit and scope of the invention should not be limited to the preferred versions of the invention described above.

We claim:

1. A field effect transistor, comprising:
an active region on a substrate;
a source electrode in electrical contact with said active region; a drain electrode in electrical contact with said active region;
a gate in electrical contact with said active region, said gate between said source electrode and said drain electrode;
a spacer layer on at least a portion of said gate opposite said substrate and at least a portion of a surface of said active region;
a field plate on said spacer layer between said gate and said drain electrode, said spacer layer extending from said field plate to said source electrode over said active region; and
a plurality of conductive buses each having a longitudinal axis extending substantially perpendicular to said field plate and said gate, said plurality of conductive buses electrically connecting said field plate to said source electrode, said plurality of conductive buses directly on and covering less than all of said spacer layer between said gate and source electrode,
wherein the longitudinal axis of at least two of said plurality of conductive buses extends on said active region in a first direction between said field plate and said source electrode over said spacer layer opposite said substrate and on said source electrode,
wherein said plurality of conductive buses are spaced apart in a second direction along a length of said field plate and extend in the first direction directly from said field plate to said source electrode over said spacer layer, and said field plate extends on said spacer layer in the second direction along which said plurality of conductive buses are spaced apart on said active region.

2. The field effect transistor of claim 1, wherein the longitudinal axis of said at least one of said plurality of conductive buses horizontally extends over said spacer layer and said gate opposite said substrate such that said spacer layer is between an upper surface of said gate and said at least one of said plurality of conductive buses.

3. The field effect transistor of claim 1, wherein said plurality of conductive buses cover less than half of a total area of said spacer layer between said field plate and said source electrode.

4. The field effect transistor of claim 1, said spacer layer comprising a plurality of strips extending between said gate and said source electrode, each of said strips having a width sufficient to support a respective one of said plurality of conductive buses.

5. The field effect transistor of claim 1, further comprising a passivation layer on said field plate and said spacer layer.

6. The field effect transistor of claim 1, wherein said field plate is disposed between said gate and said drain electrode and extends on said spacer layer on a top surface and sidewall of said gate in the second direction continuously between said plurality of conductive buses.

7. The field effect transistor of claim 1, wherein said field plate is disposed at least partially between said gate and said drain electrode and overlaps at least a portion of said gate.

8. The field effect transistor of claim 1, wherein said field plate is disposed at least partially between said gate and said drain electrode and overlaps only a portion of said gate.

9. A field effect transistor, comprising:
an active region on a substrate;
a source electrode in electrical contact with said active region; a drain electrode in electrical contact with said active region;
a gate in electrical contact with said active region, said gate between said source electrode and said drain electrode;
a spacer layer on at least a portion of said gate opposite said substrate and at least a portion of a surface of said active region;
a field plate on said spacer layer such that said field plate is separated from said gate by said spacer layer, said field plate disposed at least partially between said gate and said drain electrode, said spacer layer extending from said field plate to said source electrode over said active region; and
at least one conductive path providing an electrical connection between said field plate and said source electrode, said at least one conductive path directly on and covering less than all of said spacer layer between said gate and said source electrode, wherein said at least one conductive path comprises a plurality of conductive buses, each of said conductive buses having a longitudinal axis extending on said active region in a first direction between said field plate and said source electrode and over said spacer layer opposite said substrate and on said source electrode, wherein said plurality of conductive buses are spaced apart in a second direction along a length of said field plate and extend in the first direction directly from said field plate to said source electrode over said spacer layer, and said field plate extends on said spacer layer in the second direction along which said plurality of conductive buses are spaced apart on said active region.

10. The field effect transistor of claim 9, said plurality of conductive buses comprising two conductive buses.

11. The field effect transistor of claim 9, said spacer layer comprising a plurality of strips extending between said gate and said source electrode, each of said strips having a width sufficient to support a respective one of said conductive buses.

12. The field effect transistor of claim 9, wherein said at least one conductive path covers less than half of a total area of said spacer layer between said field plate and said source electrode.

13. The field effect transistor of claim 9, wherein said gate is gamma-shaped such that the gate comprises a horizontal portion and a vertical portion extending away from said horizontal portion, wherein said gate terminates at an intersection between said horizontal portion and said vertical portion without extending past an edge of the horizontal portion opposite the vertical portion, and said field plate extends on a top surface and a sidewall of said gate on a side of said gate not having said horizontal portion.

14. The field effect transistor of claim 13, wherein said horizontal portion of said gate extends toward said source electrode from said vertical portion and away from said field plate, and said vertical portion is perpendicular to said substrate so that a lower surface of said horizontal portion of said gate is separated from said substrate by a volume, said spacer layer conforming to an upper surface of said gate, wherein said volume is filled by a portion of said spacer layer.

15. The field effect transistor of claim 1, wherein said field plate does not overlap said gate.

16. The field effect transistor of claim 1, wherein said field plate is laterally separated from said gate.

17. The field effect transistor of claim 1, wherein a lateral distance Lgf between said field plate and said gate is greater than zero.

18. The field effect transistor of claim 9, wherein said field plate does not overlap said gate.

19. The field effect transistor of claim 9, wherein said field plate is laterally separated from said gate.

20. The field effect transistor of claim 9, wherein a lateral distance Lgf between said field plate and said gate is greater than zero.

21. A field effect transistor, comprising:
an active region on a substrate;
a source electrode in electrical contact with said active region; a drain electrode in electrical contact with said active region;
a gate in electrical contact with said active region, said gate between said source electrode and said drain electrode;
a spacer layer on at least a portion of said gate opposite said substrate and at least a portion of a surface of said active region;
a field plate on said spacer layer between said gate and said drain electrode, wherein at least a portion of said field plate overlaps said gate, said spacer layer extending from said field plate to said source electrode over said active region; and
a plurality of conductive buses connecting said field plate to said source electrode,
wherein each of said plurality of conductive buses extends on said active region of the field effect transistor between said field plate and said source electrode and over said spacer layer opposite said substrate and on said source electrode,
wherein a longitudinal axis of each of said plurality of conductive buses horizontally extends in a first direction above said spacer layer and said gate such that said spacer layer is between an upper surface of said gate and respective ones of said plurality of conductive buses,
wherein said plurality of conductive buses are spaced apart in second direction along a length of said field plate and extend in the first direction directly from said field plate to said source electrode over said spacer layer, and said field plate extends on said spacer layer in the second direction along which said plurality of conductive buses are spaced apart on said active region.

22. The field effect transistor of claim 21, wherein said plurality of conductive buses cover less than half of a total area of said spacer layer between said field plate and said source electrode and field plate extends on said spacer layer on a top surface and sidewall of said gate in the second direction continuously between said plurality of conductive buses.

23. The field effect transistor of claim 9, wherein the longitudinal axis of each of said plurality of conductive buses horizontally extends over said spacer layer and said gate opposite said substrate such that said spacer layer is between an upper surface of said gate and respective ones of said plurality of conductive buses.

24. The field effect transistor of claim 1, further comprising an insulating layer on said active region and said field plate opposite the substrate.

25. The field effect transistor of claim 9, further comprising an insulating layer on said active region and said field plate opposite the substrate.

26. The field effect transistor of claim 21, further comprising an insulating layer on said active region and said field plate opposite the substrate.

* * * * *

UNITED STATES PATENT AND TRADEMARK OFFICE
CERTIFICATE OF CORRECTION

| | |
|---|---|
| PATENT NO. | : 11,664,429 B2 |
| APPLICATION NO. | : 15/696050 |
| DATED | : May 30, 2023 |
| INVENTOR(S) | : Wu et al. |

It is certified that error appears in the above-identified patent and that said Letters Patent is hereby corrected as shown below:

On the Title Page

(71) Applicant: Please correct "Cree, Inc., Goleta, CA (US)" to read --Wolfspeed Inc., Durham, NC (US)--

Signed and Sealed this
First Day of August, 2023

Katherine Kelly Vidal
*Director of the United States Patent and Trademark Office*